United States Patent
Douglas et al.

(10) Patent No.: US 6,432,317 B1
(45) Date of Patent: Aug. 13, 2002

(54) METHOD TO PRODUCE MASKING

(75) Inventors: Monte A. Douglas, Coppell; Richard A. Stoltz, Plano, both of TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 08/286,106

(22) Filed: Aug. 4, 1994

Related U.S. Application Data

(63) Continuation of application No. 07/997,632, filed on Dec. 28, 1992, now abandoned, which is a continuation of application No. 07/662,538, filed on Feb. 28, 1991, now abandoned.

(51) Int. Cl.⁷ .................. H01L 21/3065; H01L 21/027
(52) U.S. Cl. .................. 216/51; 216/67; 216/75; 216/77; 216/79; 216/62; 438/720; 438/723; 438/724; 438/766; 438/770; 438/945; 148/DIG. 105
(58) Field of Search .................. 156/628.1, 643.1, 156/659.11; 216/62, 87, 41; 427/585, 597, 581, 504, 552, 526; 437/228 M

(56) References Cited

U.S. PATENT DOCUMENTS

| | | | | |
|---|---|---|---|---|
| 4,282,647 A | * | 8/1981 | Richman | 148/DIG. 105 |
| 4,426,247 A | * | 1/1984 | Tamamura et al. | 156/643 |
| 4,560,421 A | * | 12/1985 | Maeda et al. | 156/628.1 |
| 4,566,937 A | * | 1/1986 | Pitts | 156/628 |
| 4,608,117 A | | 8/1986 | Ehrlich et al. | 427/304 |
| 4,612,085 A | * | 9/1986 | Jelks et al. | 156/659.11 |
| 4,615,904 A | * | 10/1986 | Ehrlich et al. | 427/38 |
| 4,626,315 A | * | 12/1986 | Kitamoto et al. | 156/628 |
| 4,677,736 A | * | 7/1987 | Brown | 437/200 |
| 4,713,258 A | * | 12/1987 | Umemura | 427/552 |
| 4,745,089 A | * | 5/1988 | Orban | 437/190 |
| 4,897,150 A | * | 1/1990 | Dooley et al. | 156/628 |
| 4,908,226 A | * | 3/1990 | Kubena et al. | 427/38 |
| 4,981,770 A | * | 1/1991 | Taylor | 430/313 |
| 5,091,337 A | * | 2/1992 | Watanabe et al. | 437/181 |
| 5,110,760 A | * | 5/1992 | Hsu | 148/DIG. 105 |

FOREIGN PATENT DOCUMENTS

| | | |
|---|---|---|
| DE | 3942472 | 12/1989 |
| EP | 0172604 | 2/1986 |
| EP | 0184352 | 6/1986 |
| EP | 0470784 | 2/1992 |
| FR | 2319926 | 2/1977 |
| WO | 8304269 | 12/1983 |

OTHER PUBLICATIONS

Deutsch, T. F., et al. *Appl.Phys.Lett.* 35(2) Jul. 15, 1979 pp. 175–177.*

Makoto Nakase, *Potential of Optical Lithography*, Optical Engineering/Apr. 1987/vol. 26 No. 4, pp. 319–324.

E. Ong and E.L. Hu., *Multilayer Resists for Fine Line Optical Lithography*, Solid State Technology/Jun. 1984, pp, 155–160.

M. J. Bowden, *Forefron of Research on Resists*, Solid State Technology/Jun. 1981, pp. 73–87.

Gene E. Fuller, *Optical Lithography Status*, Solid State Technology/Sep. 1987, pp. 113–118.

Yukinori Ochiai, et al., *Focused Ion Beam Technology*, Solid State Technology/Nov. 1987, pp. 75–79.

W. R. Brunsvold, et al., *Resist Technology for Submicrometer Optical Lithography*, Optical Engineering/Apr. 1987/vol. 26 No. 4, pp. 330–336.

* cited by examiner

*Primary Examiner*—Anita Alanko
(74) *Attorney, Agent, or Firm*—Wade James Brady, III; Frederick J. Telecky, Jr.

(57) ABSTRACT

This is a method for masking a structure 12 for patterning micron and submicron features, the method comprises: forming at least one monolayer 32 of adsorbed molecules on the structure; prenucleating portions 46,48 of the adsorbed layer by exposing the portions corresponding to a desired pattern 36 of an energy source 42; and selectively forming build-up layers 66,68 over the prenucleated portions to form a mask over the structure to be patterned. Other methods are also disclosed.

16 Claims, 1 Drawing Sheet

METHOD TO PRODUCE MASKING

This application is a capital Continuation, of application Ser. No. 07/997,632 now abandoned which is a continuation of Ser. No. 07/662,538 now abandoned, filed Dec. 28, 1992 and Feb. 28, 1991.

CROSS-REFERENCE TO RELATED APPLICATIONS

The following coassigned patent applications, now abandoned are hereby incorporated herein by reference:

| Serial No. | Filing Date | TI Case No. |
| --- | --- | --- |
| 07/555,229 | 07/19/90 | TI-10824A NOT ALLOWED |
| 07/606,231 | 10/31/90 | TI-14237 |

NOTICE (C) Copyright, *M* Texas Instruments Incorporated 1991. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

FIELD OF THE INVENTION

This invention generally relates to semiconductor devices and in particular for masking methods to form submicron features.

BACKGROUND OF THE INVENTION

The semiconductor industry is constantly striving to achieve higher density electronic devices. As the industry has moved into micron and submicron sized features to achieve higher densities, the need for improved masking methods to create such minute features has increased.

One way to achieve high resolution of a submicron sized feature is to increase the numerical aperture of the optical imaging system used to produce a patterned image of the feature. Unfortunately, increasing the numerical aperture of the imaging system to achieve higher resolution results in a drastically reduced depth of field.

Other problems are associated with conventional masking techniques, such as a lack of uniformity of exposure of resist through a thick layer of resist and scattered light within the layer of resist due to reflective metallized surfaces under the resist. These problems tend to compound the loss of resolution problem by creating ill-defined patterns at the onset. Thus, there is a need for a method for forming high resolution submicron sized features on a semiconductor device.

SUMMARY OF THE INVENTION

This is a method for masking a structure for patterning micron and submicron features, the method comprises: forming at least one monolayer of adsorbed molecules on the structure; prenucleating portions of the adsorbed layer by exposing the portions corresponding to a desired pattern of an energy source; and selectively forming build-up layers over the prenucleated portions to form a mask over the structure to be patterned.

Preferably the adsorbed layer is removed from the structure, except at prenucleating sites, before the build-up layers are formed; and a portion of the structure is etched to form patterned micron or submicron features. Also, the prenucleated portions and the build-up layers, if not destructive to the performance of the final structure, may be left as a portion of said final structure; the build-up layers may be used to pattern an organic etch resist; the structure may be a single layer substrate or at least one layer over a substrate layer; the energy source may be a radiant energy source or a particle energy source; the prenucleated portions and/or the build-up layers may be formed in a vacuum chamber, may be formed from an energy dissociable gas, and may be metal.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
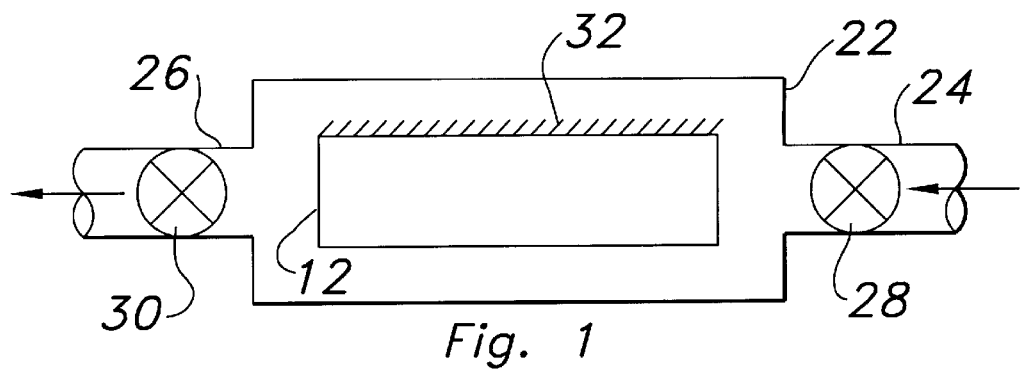
FIG. 1 is a cross-sectional view of the formation of the adsorbed layer.

Referring to FIG. 1, a structure 12 is placed in a pressure chamber 22 which is made air tight by appropriate seals, not shown, and is provided with an inlet 24 and an outlet 26. Inlet 24 and outlet 26 each have a flow valve 28 and 30, respectively, to control access to the chamber 22. The structure 12 may be a single layer of material, or multiple layers of different materials, depending on the application. The point of importance is that there is a need to pattern a portion of the structure 12.

A photosensitive gas is pumped into the chamber 22 via inlet 24. A photosensitive gas such as, for example, trimethyl aluminum ($Al(CH_3)_3$), will photodissociate (i.e. break up into its more simple constituents upon exposure to a specified wavelength of light) and deposit one or more of the constituents (e.g. aluminum) on the structure 12 surface. The photosensitive gas is pressurized, for example, to 20 torr, until a monolayer 32 of adsorbed gas molecules forms on the structure 12. After the required time, the unadsorbed photosensitive gas is evacuated through outlet 26.

Figure 2:
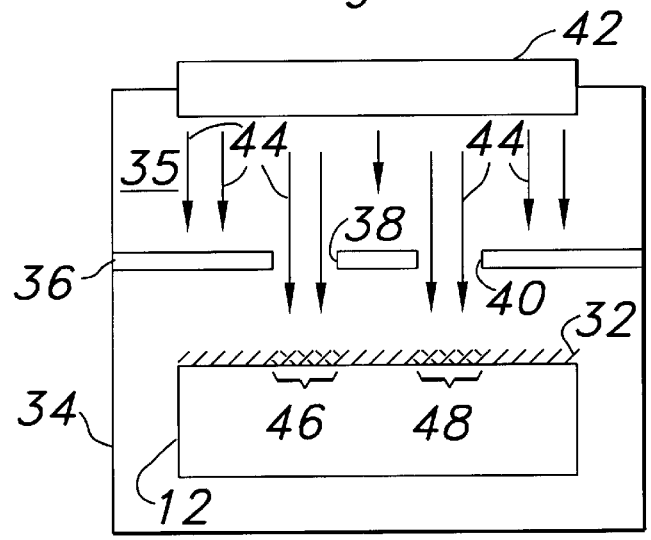
FIG. 2 is a cross-sectional view of the prenucleation formation step.

The structure 12 is then placed in an imaging system 34 such as, for example, a projection printer, as shown in FIG. 2. The system 34 comprises a chamber 35 for receiving the structure 12 and a patterning mask 36. The mask 36 is removably fixed to chamber 35 above the structure 12 and is provided with cut-outs, for example, cut-outs 38 and 40, corresponding to the desired pattern to be transferred to the structure 12. An energy source 42 is installed into the chamber 35 to provide the energy needed to photodissociate the adsorbed monolayer 32.

The energy source 42 is selected to be compatible with the adsorbed layer 32. The energy rays, as indicated by arrows 44, have an energy sufficient to dissociate the gas in the adsorbed layer 32. For example only, a wavelength of approximately 193 nanometers should be sufficient to photodissociate most gases that may be selected, in an optical imaging system.

The adsorbed monolayer 32 is exposed to the energy source 42 through cut-outs 38 and 40 in the mask 36. As previously discussed, the energy source 42 causes the adsorbed monolayer 32 to photodissociate and create prenucleation sites 46 and 48 on structure 12. Prenucleation sites 46 and 48 are comprised of one of the simpler constituents of the photosensitive gas of adsorbed layer 32. For example, if the photosensitive gas comprises trimethyl aluminum, the photodissociation will cause the methyl ($CH_3$) to break from the surface of the structure 12 leaving prenucleation sites comprised of aluminum (Al).

The adsorbed layer 32 surrounding the prenucleated sites 46 and 48 remain unaffected by the energy source 42 since mask 36 provides exposure only to the prenucleated sites. It may be desirable at this point to remove the remaining non-nucleated regions of the adsorbed layer 32 by any appropriate method, such as heating, dissolving or etching, which will provide a clean surface for subsequent steps.

The prenucleation sites are then used to initiate further deposition which joins sites in the region to form a mask of the desired pattern. This can be done by selective deposition (e.g. tungsten from $WF_6$ by chemical vapor deposition (CVD) assisted by directed energy) nucleated by the prenucleation sites. By this method, build-up layers 66 and 68 may be selectively deposited on the prenucleated sites 46 and 48, this may or may not be done in a vacuum, depending on the process and materials used.

Figure 3:
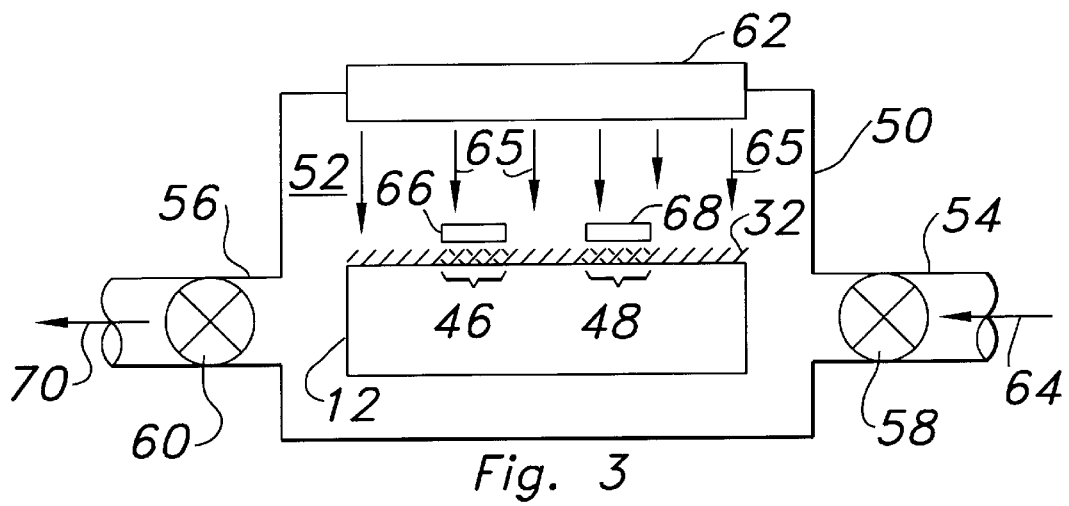
FIG. 3 is a cross-sectional view of the unpatterned energy exposure.

Referring to FIG. 3, the structure 12 with the prenucleated sites 46 and 48 ready for build-up may alternately be placed in an unpatterned energy exposure apparatus 50 (as an alternative to the build-up by the selective deposition of tungsten, for example). The apparatus 50 is appropriately sealed, not shown, to provide a vacuum chamber 52 with an inlet 54 and an outlet 56. Inlet 54 and outlet 56 are each provided with flow valves 58 and 60, respectively, to control access to chamber 52. An energy source 62 is installed in the top of the chamber 52 to provide the energy needed to produce photodissociation during the energy exposure. The energy source 62 must be compatible with the photosensitive gas selected for energy exposure. A photosensitive gas is allowed to fill chamber 52 through inlet 54 as indicated by arrow 64. The energy source 62 is activated to produce energy rays as indicated by arrows 65 which pass through the photosensitive gas filling the chamber 52. The energy rays photodissociate the gas into simpler constituents thereof creating condensable and non-condensable atoms. The condensable atoms will selectively nucleate on the prenucleated sites 46 and 48. Therefore, the prenucleated sites 46 and 48 will build up layers of the condensable atoms to form build-up layers 66 and 68. After a predesignated amount of time, the remaining gas is evacuated through outlet 56 as indicated by arrow 70. Thus, if the photosensitive gas were trimethyl aluminum, the energy rays 66 might dissociate the gas into partially dissociated product. One or two of the three methyl molecules would remain as a non-condensable gas, whereas the aluminum atoms and remaining methyl molecules would be condensable. The condensable atoms would collect upon the prenucleated sites 46 and 48 and further dissociate to form the build-up layers 66 and 68.

Figure 4:
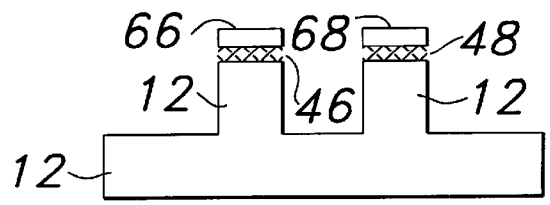
FIG. 4 is a cross-sectional view of using an etchant to transfer the pattern.

FIG. 4 illustrate the results of the final stages of the preferred embodiment of the present invention. The desired pattern under the build-up layers 66 and 68 may now be transferred to the structure 12 by any appropriate etch process, such as plasma dry etching with a halogen based etchant, to etch the structure 12 that is not under the build-up layers 66 and 68. The resulting products are layered columns comprising a portion of the structure 12, prenucleated sites 46 and 48, respectively, and build-up layers 66 and 68, respectively.

Once the plasma etch is completed, the prenucleated sites 46 and 48, and the build-up layers may be removed, for example, by an etching process, or they may be left as they are, depending on the material used and the effect on subsequent processing steps and the completed device. The final result is the desired submicron pattern formed on the structure 12.

The method described above may be used in many applications and with many processes and materials. The energy used to produce a patterned image on the structure 12 may encompass a broad spectrum of sources. These include those commonly used, such as the g-line or the i-line from a Hg arc discharge lamp, or, for example, deep ultra-violet light, x-rays, e-beams, or ion sources may be used. Therefore, limitations due to specific energy sources is overcome. The terms photodissociable and photosensitive are used for convenience in the above description, however, the term photo may be replaced with radiant energy or electromagnetic energy, or particle energy, for example, throughout the discussion (e.g. photodissociable may be replaced with radiant energy dissociable).

The deposition processes that may be prenucleated to produce a masking layer are also broad in scope. For example, any fluid used for chemical vapor deposition (CVD), photo-activated or plasma-enhanced CVD, or electron cyclotron resonance deposition may be used (e.g. generally metal-organic or metal halides may be used). The material that is deposited may be metal, insulator, or semiconductor. The choice of material is not limited to the low temperature domain of organic material (which is commonly used in conventional masking techniques), but is driven by the application. As a result, the applications for the masking scheme described above are very diverse. For example, it may be used to mask high resolution ion implants, oxidation of silicon, or etching of underlying films. The masking may be used to pattern another masking material and thus be used to indirectly pattern permanent features on the final structure (e.g. to mask an organic etch resist).

In Table 1 below, a nonexhaustive list of possible materials which may be used in the aforementioned method is provided. The table contains potential combinations of masking materials (e.g. the Al prenucleated regions and/or build-up layers), the carrier species (e.g. $Al(CH_3)_3$ as a photodissociable gas or $WF_6$ as an energy dissociable gas), and the etched material (e.g. the top layer of the structure 12, in which the submicron features are to be formed). The table is meant for clarification and example purposes only and should not be considered in a limiting sense.

A preferred embodiment has been described in detail hereinabove. It is to be understood that the scope of the invention also comprehends embodiments different from those described, yet within the scope of the claims. Words of inclusion are to be interpreted as nonexhaustive in considering the scope of the invention.

While this invention has been described with reference to illustrative embodiments, this description is not intended to be construed in a limiting sense. Various modifications and combinations of the illustrative embodiments, as well as other embodiments of the invention, will be apparent to

TABLE 1

| MASKING MATERIAL | CARRIER SPECIES | ETCHED MATERIAL |
| --- | --- | --- |
| Al | $Al(CH_3)_3$ | $SiO_2$ |
| Al | $Al(CH_3)_3$ | $Si_3N_4$ |
| Al | $Al(CH_3)_3$ | Si |
| Al | $Al(CH_3)_3$ | W |
| Pb | $Pb(CH_3)_4$ | $SiO_2$ |
| Pb | $Pb(CH_3)_4$ | $Si_3N_4$ |
| Pb | $Pb(CH_3)_4$ | Si |
| Pb | $Pb(CH_3)_4$ | W |
| Mo | $Mo(CO)_6$ | Al |
| Mo | $Mo(CO)_6$ | Si |
| Mo | $Mo(CO)_6$ | TiN |
| Mo | $Mo(CO)_6$ | $Ta_2O_5$ |
| W | $WF_6$ | Si |
| W | $WF_6$ | $SiO_2$ |
| W | $WF_6$ | Al |

What is claimed is:

1. A method for masking a structure for patterning micron and submicron features, said method comprising:
   a. forming at least one monolayer of adsorbed molecules on a partially completed integrated circuit structure;
   b. prenucleating portions of said adsorbed layer by exposing said portions corresponding to a desired pattern of an energy source;
   c. selectively forming build-up layers over said prenucleated portions to form a mask over said structure; and
   d. etching said structure in areas not covered by said mask to form patterned features.

2. The method of claim 1, wherein said adsorbed layer is removed from said structure, except at prenucleating sites, before said build-up layers are formed.

3. The method of claim 1, wherein said prenucleated portions and said build-up layers are not destructive to the performance of the final structure and are left as a portion of said final structure.

4. The method of claim 1, wherein said etching comprises etching a corresponding pattern in an organic etch resist.

5. The method of claim 1, wherein said structure is a single layer substrate.

6. The method of claim 1, wherein said structure is at least one layer over a substrate layer.

7. The method of claim 1, wherein said prenucleated portions and/or said build-up layers are formed in a vacuum chamber.

8. The method of claim 1, wherein said prenucleated portions and/or said build-up layers are formed from an energy dissociable gas.

9. The method of claim 1, wherein said prenucleated portions and/or said build-up layers are metal.

10. A method for masking and implanting a structure comprising:
    a. forming at least one monolayer of adsorbed molecules on a partially completed integrated circuit structure;
    b. prenucleating portions of said adsorbed layer by exposing said portions corresponding to a desired pattern of an energy source;
    c. selectively forming build-up layers over said prenucleated portions to form a mask over said structure; and
    d. implanting into portions of said structure not covered by said mask.

11. A method for masking and oxidizing a structure comprising:
    a. forming at least one monolayer of adsorbed molecules on a partially completed integrated circuit structure;
    b. prenucleating portions of said adsorbed layer by exposing said portions corresponding to a desired pattern of an energy source;
    c. selectively forming build-up layers over said prenucleated portions to form a mask over said structure; and
    d. oxidizing a surface of said structure not covered by said mask.

12. The method of claim 10 wherein said build-up layers are metal.

13. The method of claim 11, wherein said build-up layers are metal.

14. The method of claim 1, wherein said energy source is a radiant energy source.

15. The method of claim 1, wherein said energy source is a particle energy source.

16. The method of claim 1, wherein said exposing comprises projection printing.

* * * * *